United States Patent [19]
Lee et al.

[11] Patent Number: 6,088,917
[45] Date of Patent: Jul. 18, 2000

[54] METHOD FOR MAKING HEAT SINK DEVICE AND A HEAT SINK MADE THEREBY

[75] Inventors: Shun-Jung Lee, Pan-Chiao; Hsien-Kun Lee, Chung-Ho, both of Taiwan

[73] Assignee: Hon Hai Precision Ind. Co., Ltd., Taipei Hsien, Taiwan

[21] Appl. No.: 09/217,670

[22] Filed: Dec. 21, 1998

[30] Foreign Application Priority Data

Dec. 26, 1997 [TW] Taiwan ................................. 86119878

[51] Int. Cl.[7] ....................................................... B23P 15/26
[52] U.S. Cl. ..................... 29/890.03; 165/185; 165/80.3; 361/704
[58] Field of Search ................................. 165/185, 80.3; 29/890.03; 361/704

[56] References Cited

U.S. PATENT DOCUMENTS

| | | | |
|---|---|---|---|
| 1,977,731 | 10/1934 | Masury | 165/185 |
| 3,327,779 | 6/1967 | Jacoby | 165/185 |
| 4,356,864 | 11/1982 | Ariga et al. | 165/185 |
| 4,733,453 | 3/1988 | Jacoby | 165/185 |
| 5,419,041 | 5/1995 | Ozeki | 29/890.03 |
| 5,421,406 | 6/1995 | Furusawa et al. | 165/185 |
| 5,535,515 | 7/1996 | Jacoby | 165/185 |
| 5,590,712 | 1/1997 | Fisher et al. | 165/185 |
| 5,642,779 | 7/1997 | Yamamoto et al. | 165/185 |

*Primary Examiner*—Ira S. Lazarus
*Assistant Examiner*—Terrell McKinnon

[57] ABSTRACT

A method for making a heat sink device comprises the steps of 1) forming a base from punching an array of mounting holes in at substrates; 2) forming a plurality of cooling fin strips from a material sheet; 3) aligning and assembling each of the cooling fins to the corresponding mounting holes of the substrate; 4) punching deformation holes in the first substrate to fixedly secure the cooling fin assembled to the mounting holes; and 5) cutting a redundant material portion from the cooling fin strips.

7 Claims, 5 Drawing Sheets

METHOD FOR MAKING HEAT SINK DEVICE AND A HEAT SINK MADE THEREBY

FIELD OF THE INVENTION

The present invention relates to a method, and more particularly to a method for making a heat sink device by assembling a plurality of cooling fin strips to at least two substrates.

DESCRIPTION OF PRIOR ART

Heat dissipation within a computer housing is critical for normal operation of a computer system. If the temperature within the computer housing exceeds a certain limit, the system will malfunction.

Conventionally, a CPU having a lower operating speed is simply installed in a socket mounted on a motherboard, and the heat generated by the CPU directly dissipates from a top surface thereof. As the operating speed increases, heat convection from the top surface of the CPU to the surrounding air is too slow to dissipate a large amount of heat. To address this problem, a heat sink having a bottom face contacting the top surface of the CPU is introduced. By this arrangement, the total heat dissipation area is increased and the operating temperature of the CPU can be maintained below an acceptable limit. However, a single heat sink is still inadequate to dissipate the heat generated from the CPU. Therefore, a cooling fan is mounted to a top of the heat sink to hasten the heat dissipation performance from an outer surface of the cooling fins to the surrounding air.

Theoretically the larger the outer surface area of the cooling fins, the better the heat dissipation, i.e., a higher density of cooling fins results in better dissipation. Nevertheless, the existing extruding technique limits the formation of the heat sink because it is difficult to manufacture a cooling fin with a narrow width. In order to increase the total surface area of cooling fins, U.S. Pat. Nos. 4,890,196, 5,038,858 and Taiwan Utility Patent No. 83212791 disclose a heat sink assembled from an individual substrate having a plurality of cooling fins.

U.S. Pat. No. 5,038,858 (hereinafter referred to as '858) discloses a heat sink device including a substrate with a plurality of retaining grooves defined in a surface thereof. Each of the retaining grooves is provided with a retaining recess. A cooling plate forming at least a hook near a bottom edge thereof is inserted into the corresponding retaining groove. When the cooling plate is inserted, the hook is engaged with the retaining groove.

U.S. Pat. Nos. 4,712,159, 4,879,891 and Taiwan Utility Patent Nos. 84212747, 85200861, and 85206293 also disclose pertinent techniques.

SUMMARY OF THE INVENTION

An objective of this invention is to provide a method for making a heat sink by assembling a plurality of blank cooling fins to a heat sink blank thereby forming a heat sink having a large increased heat dissipation area.

Another objective of this invention is to provide a method for making a heat sink wherein a plurality of cooling fin strips can be easily assembled to at least two substrates.

In order to achieve the objectives set forth, a method in accordance with the present invention generally comprises the steps of: 1) punching an array of mounting holes in a first and second substrate; 2) forming a plurality of cooling fin strips from a material sheet; 3) aligning each of the cooling fins with the mounting holes and assembling the cooling fins into the corresponding mounting holes; 4) deforming at least one of the substrates to fixedly secure the cooling fins assembled to each mounting hole; and 5) cutting a redundant material portion from the cooling fins strip.

These and other objectives, features, and advantages of the present invention will become apparent after reading the following detailed description of the preferred embodiment of the invention taken in conjunction with the appended drawings.

DETAILED DESCRIPTION OF PREFERRED EMBODIMENT

Figure 1:
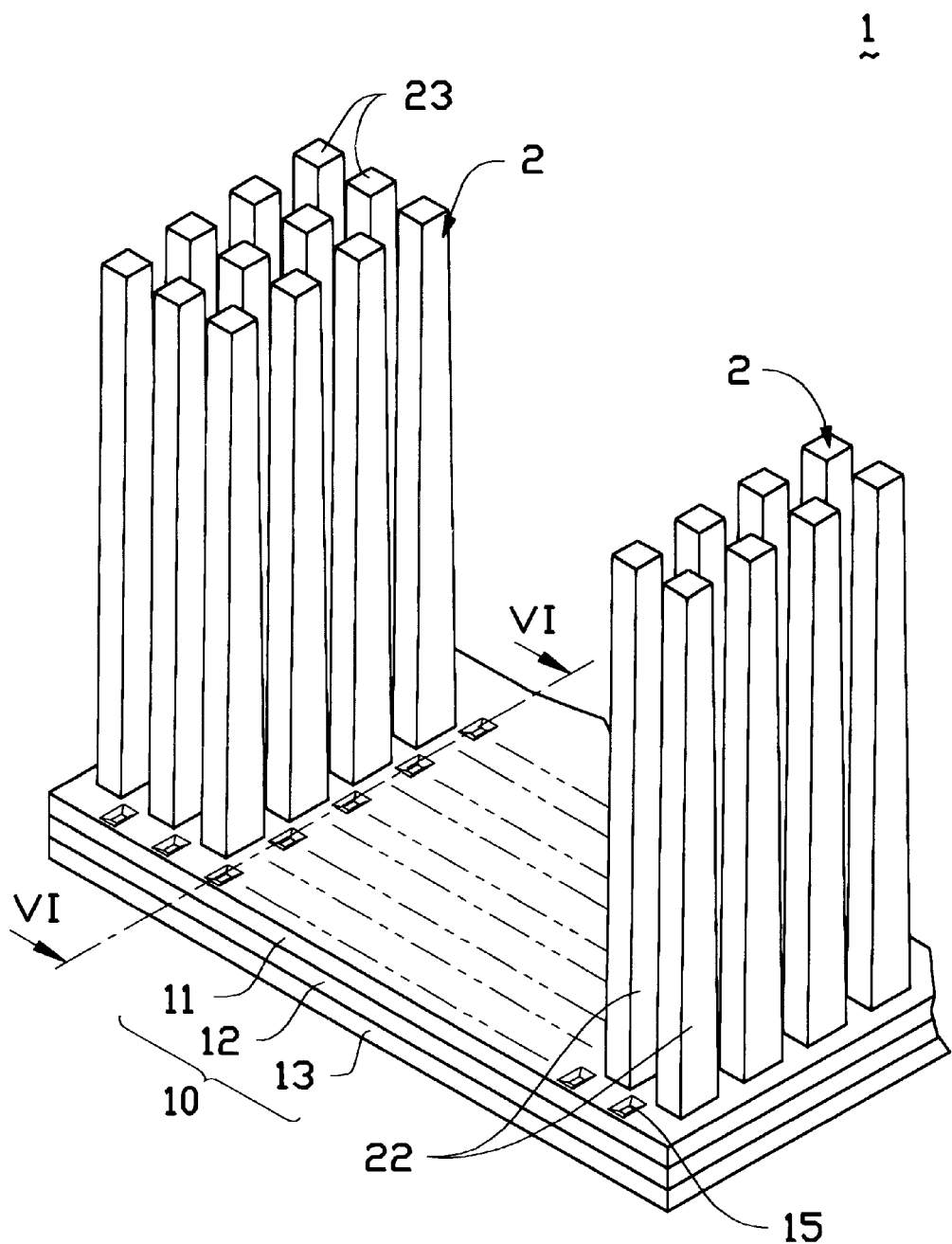
FIG. 1 is a perspective view of a heat sink in accordance with the present invention.
Figure 3:
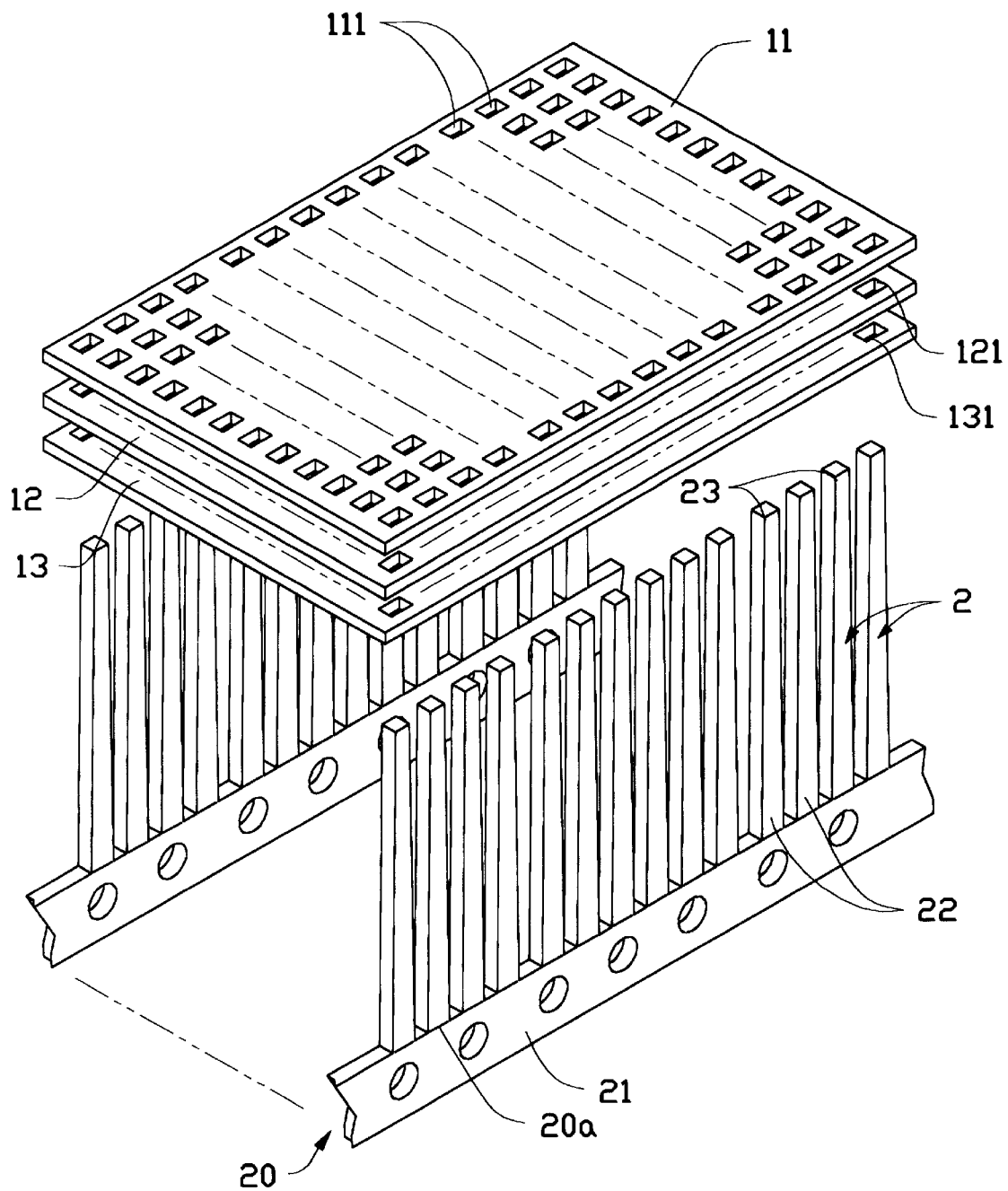
FIG. 3 is an exploded view of a heat sink made in accordance with the present invention.

Referring to FIGS. 1 and 3, a heat sink 1 in accordance with the present invention comprises a base 10 formed by three substrates 11 12, and 13. Each 25 substrate 11 (12 13) is defined with an array of mounting holes 111 (121, 131) which jointly define a passage (not labeled) when the substrates 11, 12 and 13 are stacked together. Each passage securely receives a cooling fin 2 therein.

The cooling fin 2 is manufactured from a material sheet and a typical one is disclosed in a contemporaneously filed U.S. application Ser. No. 09/192,879, and filed on Nov. 16, 1998. The specification is enclosed for reference.

Referring to FIG. 3, the diameter of the mounting hole 111 is smaller than the base 22 but larger than a top end 23 of each cooling fin 2. By this arrangement, after the cooling fin 2 is inserted into the corresponding passage, the base 22 has an interferential engagement with the mounting hole 111. After the fins 2 are assembled to the base 10 an array of deformation holes 15 is defined therein causing a deformation of an inner wall of the passage. By the deformation of the inner wall of the passage, each cooling fin 2 is securely retained therein.

As disclosed in the above-mentioned contemporaneously filed US application, two sets of cooling fin strips 20 can be simultaneously stamped from a material sheet (not shown). During the forming process, a separating groove 20a is defined between the base 22 of the cooling fin 2 and a redundant material portion 21 of the cooling fin strip 20. After each cooling fin strip 20 is assembled, the redundant material portion 21 can be cut therefrom and a heat sink device 1 in accordance with the present invention is achieved.

Figure 2:
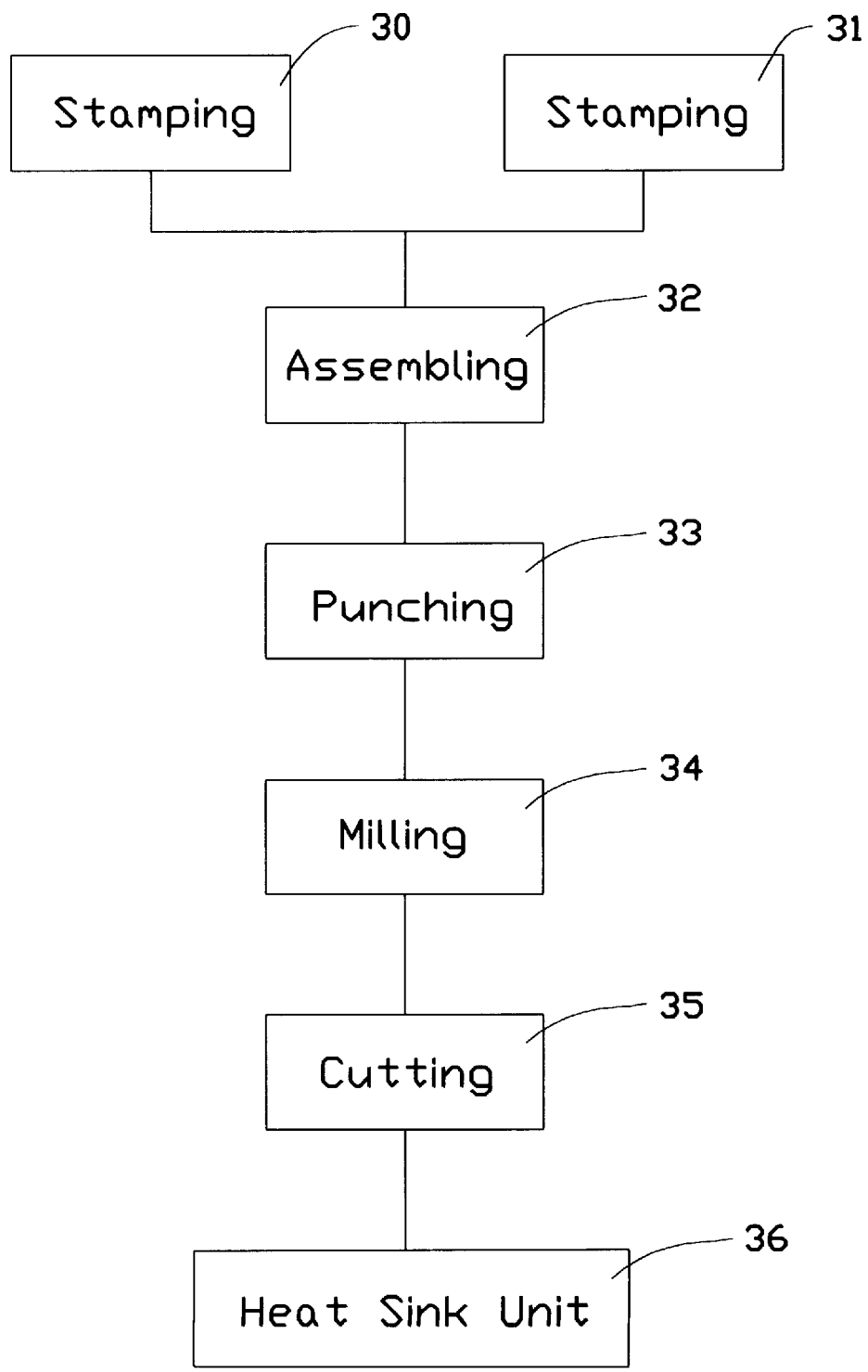
FIG. 2 is a flow chart of a manufacturing process of the heat sink device in accordance with the present invention.

Referring to FIG. 2, the assembly of the heat sink device 1 can be achieved by the following steps.

1) A first step 30 of stamping to define an array of mounting holes on substrates;

2) A second step 31 of stamping two sets of cooling fin strips 20 from a material sheet;

3) A third step 32 of assembling each cooling fin to the corresponding mounting hole:

4) A fourth step 33 of punching an array of deformation holes on an upper substrate;

5) A fifth step 34 of milling a bottom surface;

6) A sixth step 35 of cutting the heat sink blank into suitable length; and

7) In the final step 36, a final product is attained.

The substrates 11, 12 and 13 for forming the base 10 can be selected from a variety of material sheets, such as an aluminum sheet which has excellent heat conductive properties. For the cooling fin strip 20, the pitch between each two adjacent cooling fins 2 is identical to the pitch between adjacent mounting holes 111. Accordingly, a row of cooling fins 2 can be readily assembled to a row of mounting holes 11. This greatly reduces assembly time.

Figure 4:
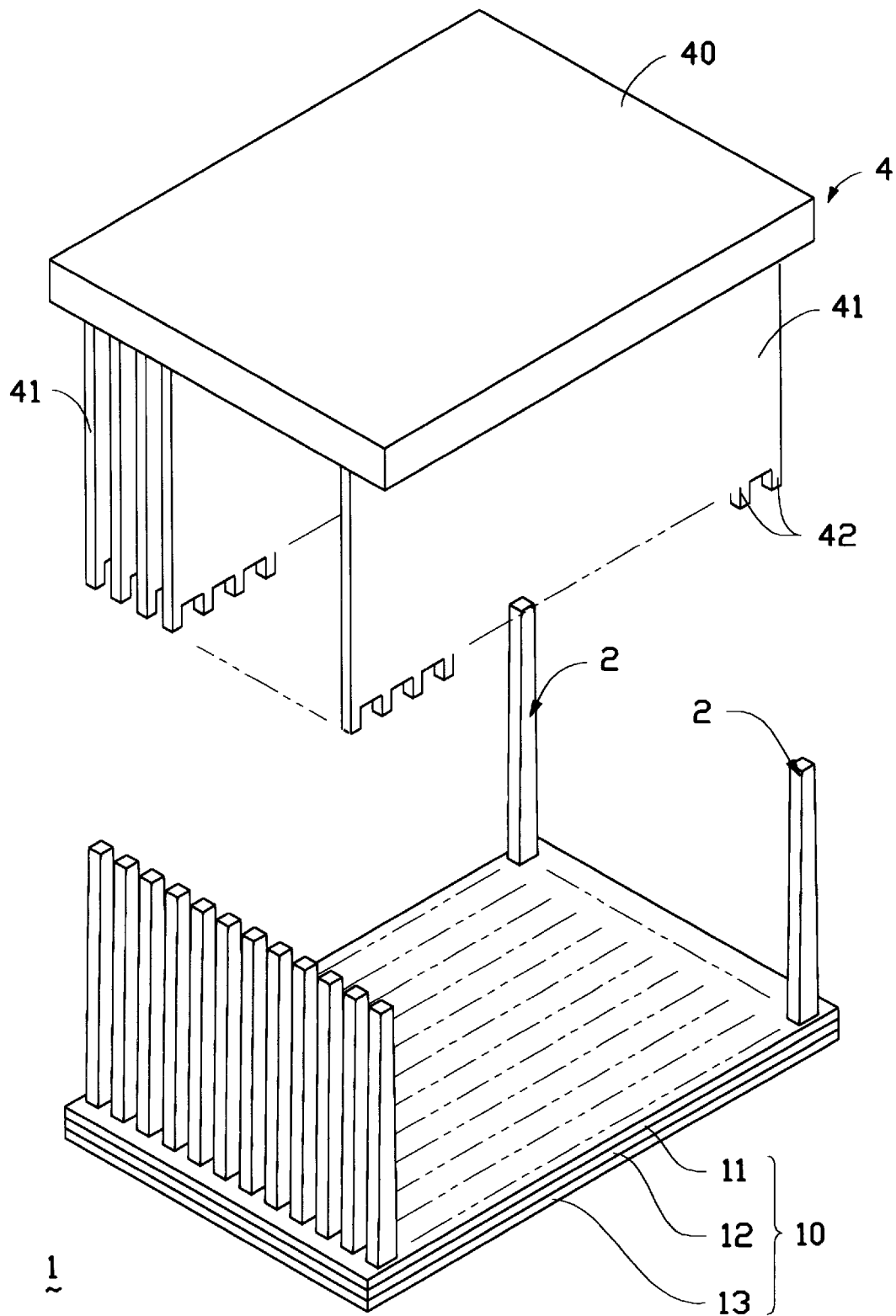
FIG. 4 is a perspective view of a tool being used to deform three substrates of FIG. 1.
Figure 5:
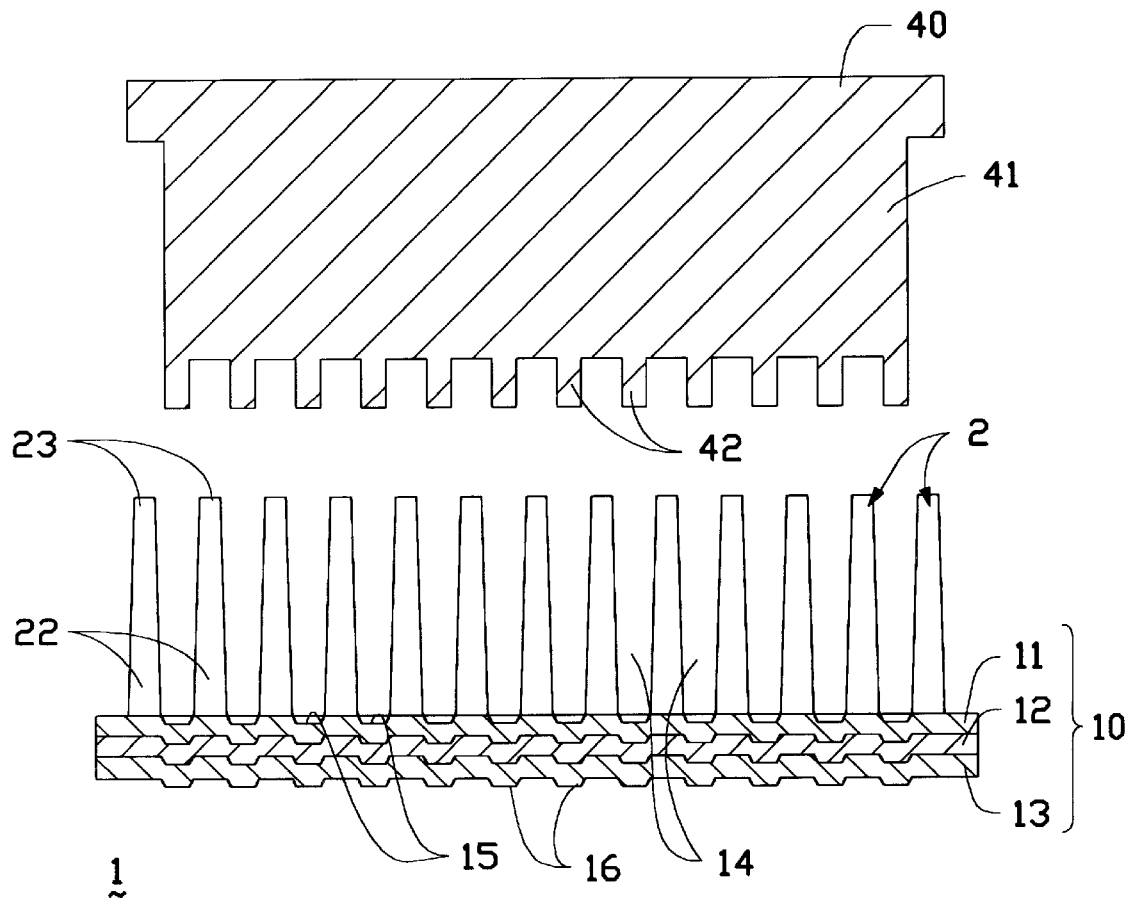
FIG. 5 is a cross sectional view of the heat sink and the deformed substrates.
Figure 6:
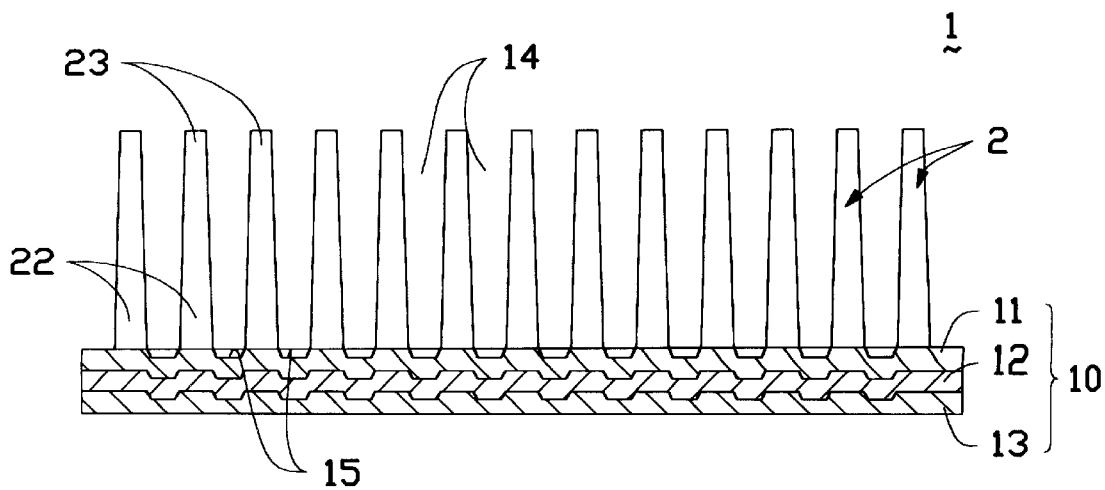
FIG. 6 is a cross sectional view taken along line VI—VI of FIG. 1 showing a flattened bottom face of the heat sink.

Referring to FIGS. 4 and 5, the substrates 11, 12, and 13 are stacked together whereby the mounting holes 111, 121, 131 are aligned to jointly define a passage for receiving the corresponding cooling fin 2 therein. After the cooling fin strips 20 are sequentially assembled to the base 10, a punching process 33 will be conducted. The sub-assembly, including the base 10 and cooling fins 2, is positioned on a mold 4, which includes an anvil (not shown) and a punching tool 41 fixedly supported by a mounting 40. Each punching tool 41 is formed with a row of driving bits 42 at an end thereof. When the punching tool 41 is displaced downward, a row of the deformation holes 15 will be defined on a span 14 between adjacent rows of cooling fins 2. The formation of each deformation hole 15 will cause a corresponding deformation of an inner wall of the adjacent passages which in turn abuts against the cooling fin 2 retained therein. Accordingly, the cooling fins 2 are fixedly retained within the base 10. Additionally, the depth of the deformation hole 15 can be accurately controlled by the stroke of the punching tool 41. As shown in FIG. 5, the formation of the deformation hole 15 causes a corresponding embossment 16 on a bottom face of the substrate 13. In this situation, the embossments 16 are flattened by means of a milling process whereby the bottom surface, as shown in FIG. 6, can smoothly contact an upper face of a CPU to maximize heat transfer therebetween.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims. Therefore, persons of ordinary skill in this field are to understand that all such equivalent structures are to be included within the scope of the following claims.

We claim:

1. A method for making a heat sink device, comprising the steps of:
    1) forming a base by punching an array of mounting holes in at least a first substrate;
    2) forming a plurality of cooling fin strips each with plural cooling fins thereon from a material sheet;
    3) aligning and assembling said cooling fins to said corresponding mounting holes of first substrate;
    4) punching an array of deformation holes in said first substrate to fixedly secure said cooling fin therein; and
    5) cutting a redundant material portion from the cooling fin strips.

2. The method as recited in claim 1, wherein said base further comprises a second substrate defining an array of mounting holes therein.

3. The method as recited in claim 2, wherein said mounting holes of said second substrate are aligned with said mounting holes of said first substrate thereby defining a passage for said corresponding cooling fin.

4. The method as recited in claim 1, wherein said cooling fin strips are directly stamped from a material sheet.

5. The method as recited in claim 1, further comprising a step of milling a bottom surface of the first substrate of the heat sink device after the step of punching.

6. The method as recited in claim 1. wherein each said cooling fin strip is inserted into said mounting holes from a bottom surface of said substrate.

7. A heat sink for use with a CPU, comprising:
    a base having at least a first and second substrates, each said substrate defining an array of mounting holes therein, said mounting holes of said first and second substrates being in alignment together thereby defining a passage;
    a plurality of cooling fins each being received within said corresponding passage; and
    deformation holes being arranged adjacent to said passage whereby an inner wall of said passage is deformed to abut against said cooling fin received therein.

* * * * *